United States Patent [19]

Willis

[11] Patent Number: 4,647,968
[45] Date of Patent: Mar. 3, 1987

[54] ANALOG-TO-DIGITAL CONVERSION SYSTEM AS FOR A NARROW BANDWIDTH SIGNAL PROCESSOR

[75] Inventor: Donald H. Willis, Indianapolis, Ind.

[73] Assignee: RCA Corporation, Princeton, N.J.

[21] Appl. No.: 677,523

[22] Filed: Dec. 3, 1984

[51] Int. Cl.⁴ .............................................. H04N 7/04
[52] U.S. Cl. ...................................... 358/141; 358/13; 340/347 CC; 340/347 AD
[58] Field of Search ...................... 358/12, 13, 19, 138, 358/141; 375/26; 340/347 AD, 347 CC, 347 M

[56] References Cited

U.S. PATENT DOCUMENTS

| | | | |
|---|---|---|---|
| 4,393,372 | 7/1983 | Hoehn | 340/347 AD |
| 4,496,935 | 1/1985 | Inoue et al. | 340/347 CC |
| 4,535,257 | 8/1985 | Hareyama | 340/347 CC |
| 4,547,763 | 10/1985 | Flamm | 340/347 CC |
| 4,566,028 | 1/1986 | Lewis, Jr. et al. | 358/13 |

Primary Examiner—James J. Groody
Assistant Examiner—Michael D. Parker
Attorney, Agent, or Firm—E. M. Whitacre; P. J. Rasmussen; K. N. Nigon

[57] ABSTRACT

A narrow bandwidth analog-to-digital conversion (ADC) system is described in the context of the color burst processing and burst phase detecting circuitry of a digital color television receiver. The ADC includes a dither generator which adds a dither signal to either the analog input signal or to the reference signal used by the ADC. This dither signal increases in magnitude by 1/16 of an LSB value at a rate one-quarter of the burst frequency and changes in sign at one-half of the burst frequency. This signal passes through a low-pass filter in the chrominance channel providing an increase in sample resolution by averaging the samples in a chroma band-pass filter and in the phase detecting circuitry.

14 Claims, 10 Drawing Figures

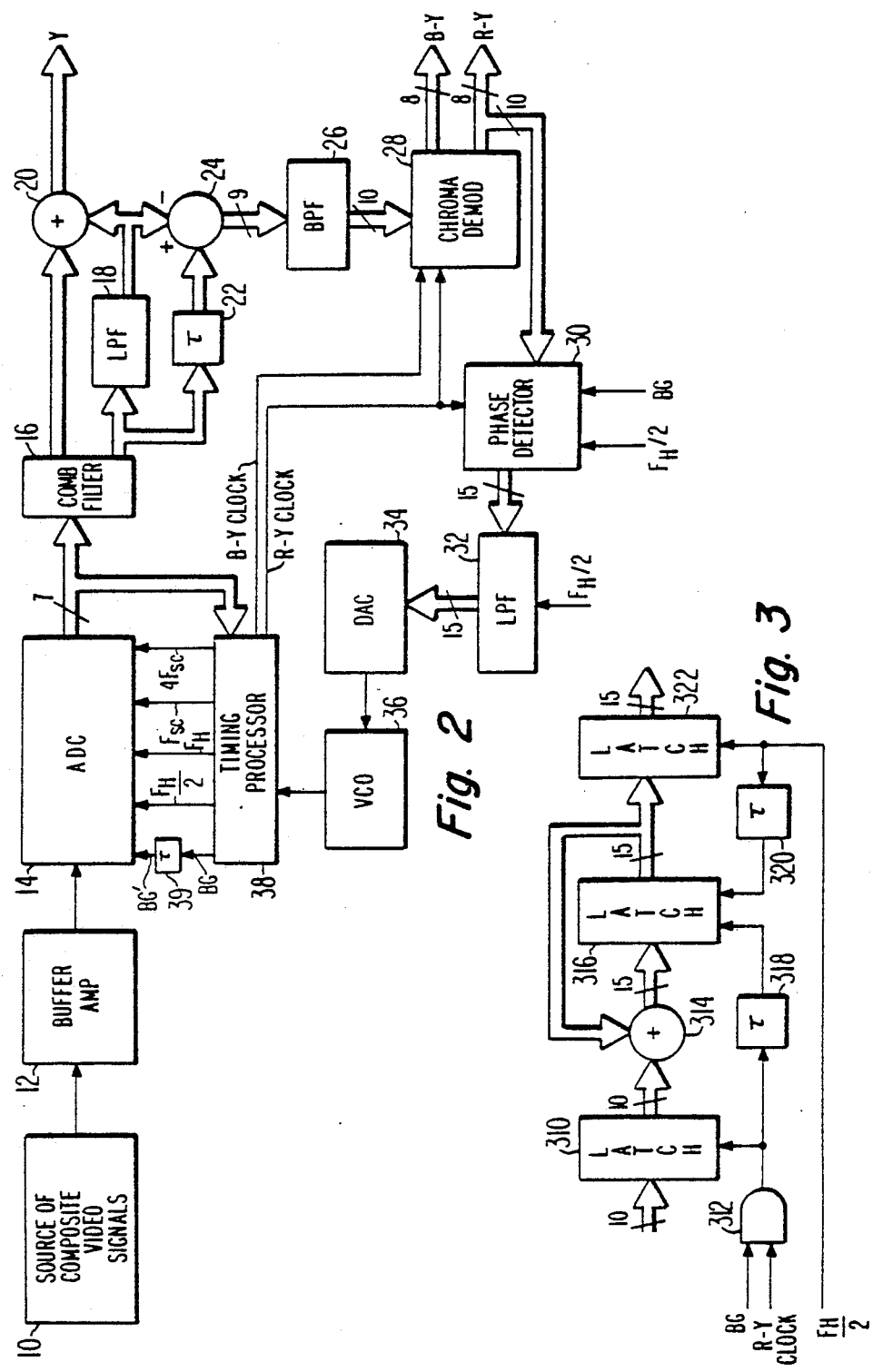

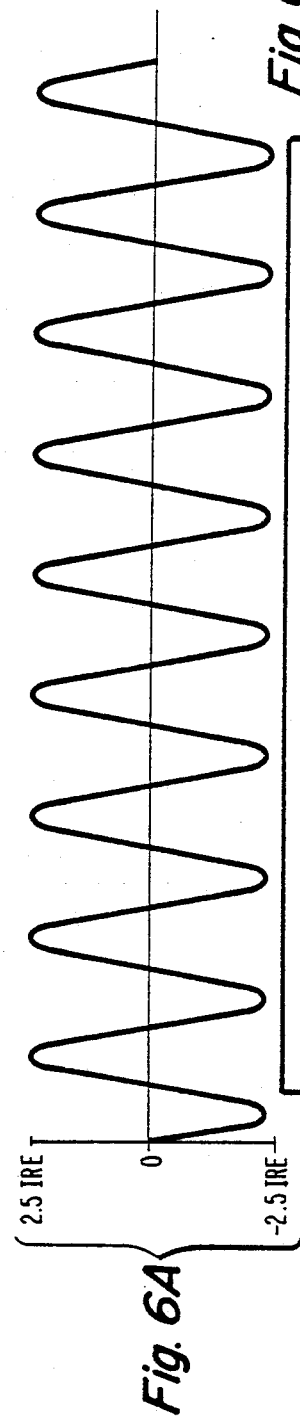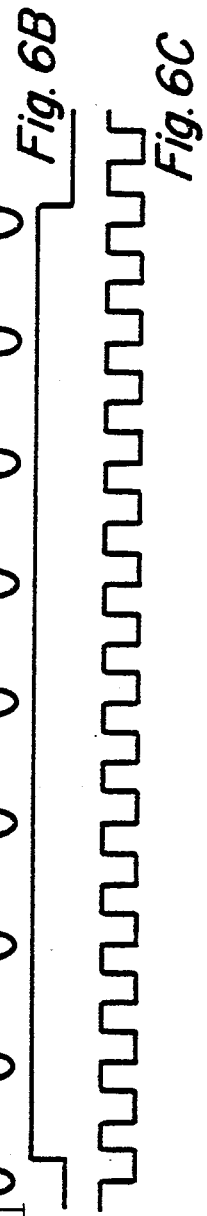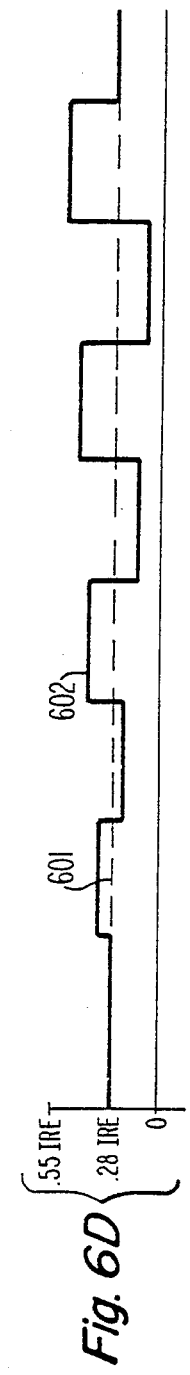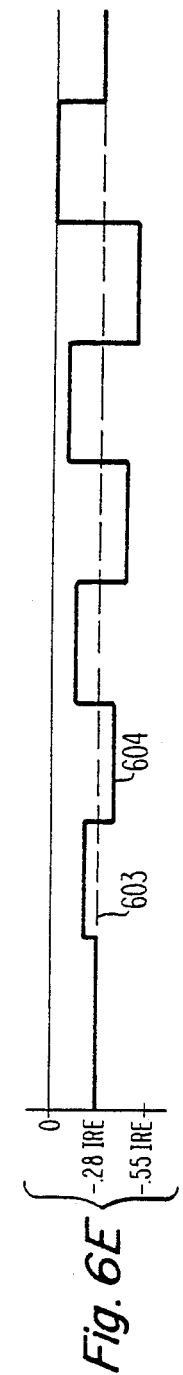

ANALOG-TO-DIGITAL CONVERSION SYSTEM AS FOR A NARROW BANDWIDTH SIGNAL PROCESSOR

The present invention relates to apparatus for improving the accuracy of analog-to-digital conversion systems which quantize narrow bandwidth analog signals.

Analog-to-digital converters (ADC's) become more difficult to construct as the number of bits of resolution is increased and as the rate at which conversions are performed is increased. Consequently, ADC's having both high resolution and a high conversion rate are relatively expensive. In consumer products, such as digital television receivers, where the cost of an ADC is a large part of the cost of the product, relatively inexpensive, ADC's having high conversion rates are required. These ADC's generally have less resolution than would be desirable.

The resolution lost by using these less expensive ADC's can often be partially recovered by well known signal processing techniques. One technique for increasing the apparent resolution of an ADC is to add a small disturbance signal, called a dither signal to the analog input signal. This dither signal causes the digital samples to change between the quantization values that are less than and greater than the value of the analog signal. When these samples are averaged, for example, by a filtering system, the dither-induced changes in quantization value contribute to the average causing the filtered digital samples to have values between the quantization level values that can be provided by the ADC. The number of possible values that an averaged sample may have, i.e. the resolution of the averaged sample, increases as the number of values that are averaged to produce the sample is increased. When a dither signal which cycles among a relatively large number of values is used in conjunction with a filter that averages a large number of samples, a significant increase in resolution can be obtained. This is true even if the amplitude of the analog signal was constant over the time period that the dither was applied.

Generally, dither signals have amplitudes which are less than the unit quantization level of the ADC, i.e. less than the value represented by the least significant bit of the digital codeword. Dither values of this magnitude are chosen to minimize any noise artifacts which may result from using a dither signal. The values of a multilevel dither signal are usually chosen to evenly subdivide the quantization level of the ADC.

There are certain limitations to adding dither signals to signals from which a narrow bandwidth signal is to be extracted. Systems which extract narrow bandwidth signals usually include filters to attenuate out of band noise. A multilevel dither signal may have components at frequencies which are attenuated by these noise reducing filters. Since digital filters operate by summing appropriately weighted and delayed samples, a noise reducing filter may also be used as an averaging filter. To act as an averaging filter, however, a noise reducing filter preferably preserves the resolution of the samples it filters. For example, a filter which averages pairs of samples having seven-bit resolution and significantly attenuates a component of the dither signal applied to those samples, should provide eight-bit samples at its output port.

A digital color television receiver is an example of a system in which an ADC that increases the resolution of narrow bandwidth signals may be used advantageously. Composite video signals include wide bandwidth luminance component signals and narrower bandwidth chrominance component signals. The chrominance signals include two quadrature phase related color difference signal components and a component which has useful information in a bandwidth that is effectively zero. This latter component is the color synchronizing burst signal. The burst signal is eight to eleven cycles of the chrominance subcarrier signal included in the composite video signal during the burst interval. Since the frequency and phase of the chrominance subcarrier signal are substantially constant, the bandwidth of the chrominance subcarrier component of the burst signal is effectively zero.

The burst signal is used in digital color television receivers to synchronize the sampling clock. Composite video signals are generally sampled at a rate equal to a multiple of the burst frequency ($f_{sc}$) to simplify the extraction of the two quadrature phase related color difference signal components from the subcarrier modulated chrominance signal. For example, when composite video signals are sampled by a $4f_{sc}$ clock that is synchronized in frequency and phase to the chrominance subcarrier component of the burst signal, the chrominance samples obtained by conventional chrominance separation techniques may be represented as interleaved samples representing the two quadrature phase related color difference signals (R-Y) and (B-Y) (i.e. as +(R-Y), +(B-Y), −(R-Y), −(B-Y) . . . etc. where the signs represent sampling phase, not sample polarity).

The phase and frequency of the sampling clock signal are desirably closely synchronized to the burst signal to minimize color distortion. Preferably, the phase of the sampling clock should vary by no more than five degrees with respect to the phase of the burst signal.

Because of the limited quantization resolution of the inexpensive ADC's which may be used in digital television receivers, phase accuracies of five degrees or less may be difficult to achieve. The amplitude of composite video signals ranges between +100 IRE for full brightness to −40 IRE for the tip of the horizontal sync pulse. This 140 IRE range is generally digitized by a seven bit ADC, having 128 discrete states. Consequently, the quantization level of the ADC is at least 1.1 IRE.

It is desirable for a digital television receiver to handle weak as well as strong signals. In particular, composite video signals having chrominance and burst components that are attenuated by 18 dB relative to the nominal values listed above should still produce color images. When the burst signal—which has a nominal amplitude of 40 IRE peak-to-peak—is reduced by 18 dB, a 5 IRE peak-to-peak signal is obtained. Since the quantization level is 1.1 IRE, the digitized burst amplitude values are accurate to ±0.55 IRE or equivalently to 22% of the 2.5 IRE peak value of the −18 dB burst signal. A 5 IRE peak-to-peak burst signal having a 10° phase difference with respect to the sampling clock signal has an analog value of 0.44 IRE at a sampling point where a burst signal having no phase difference with respect to the sampling clock has a value of 0 IRE. A seven-bit ADC produces the same digital value for all analog values between −0.55 IRE and +0.55 IRE. Consequently, phase errors of 10° or less may not be detected unless the quantization resolution of the samples provided by the ADC can be increased. Quantization of the burst component is further complicated by the presence of spurious low frequency signal components in the burst signal which may reduce the effectiveness of any dither signal added to the burst signal.

FIG. 1 illustrates a composite video signal waveform which has been amplified by a typical video amplifier. The frequency response of these amplifiers is flat down to approximately 30 Hz. The roll-off in the response below 30 Hz causes a slope in the mean value of the burst signal as illustrated by the dashed line 101. The amplifiers which cause this low frequency distortion may be located on either end of the signal transmission path. Low frequency distortion components may also be added to the composite video signal and, thus, to the burst signal, by improper AC coupling in the video signal processing circuitry or by the black-level clamping circuitry used in a television signal processor. Low frequency distortion components of this sort are generally removed by a band-pass filter in the chrominance signal processing circuitry of a television receiver.

One solution to this problem is disclosed in U.S. Pat. No. 4,291,332 entitled "Phase-Locked Circuit". This patent relates to a phase-locked loop in which a staircase dither signal is added to the color synchronizing burst component of a composite video signal before it is digitized. Each cycle of a burst interval is assigned a different dither value. The dithered analog signal is then sampled by an ADC at the sampling clock frequency rate. The respective sampling points of all processed burst cycles are averaged in a digital phase error detector. Arithmetic operations are performed on these averaged samples to determine the phase difference between the received burst signal and the sampling clock signal generated by the phase-locked loop.

Ostensibly, this system increases the resolution of the quantized burst signal when there is negligable low frequency distortion of the burst signal. However, when a burst signal similar to the waveform of FIG. 1 is processed, the low frequency components of the staircase dither signal are partially offset by the low frequency distortion components which cause the burst to slope. This offset dither signal is less effective than the original staircase dither for reducing the quantization error of the burst signal since values of the dither signal no longer accurately subdivide the quantization level.

SUMMARY OF THE INVENTION

The present invention is an analog to digital conversion system which includes means for varying the correspondence between the analog input signal and the quantized samples. The change in correspondence varies alternately between relatively positive and relatively negative values at a rate substantially equal to a predetermined frequency. The magnitude of the change in correspondence increases monotonically over a predetermined number of samples at a rate not greater than the predetermined frequency.

BRIEF DESCRIPTION OF THE DRAWINGS

FIG. 2 is a block diagram of a portion of a digital television signal processing system incorporating an embodiment of the present invention.

FIG. 3 is a block diagram of the phase detector used in the circuit shown in FIG. 2.

FIGS. 6A through 6E illustrate waveforms useful for explaining the operation of the system shown in FIG. 2.

DETAILED DESCRIPTION

Figure 1:
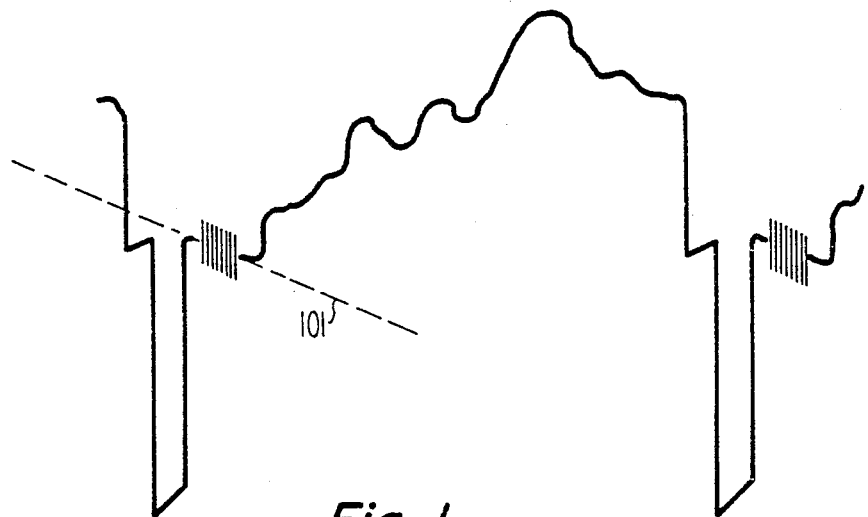
FIG. 1 (described above) illustrates a video signal waveform that is useful for explaining the environment of the present embodiments of the invention.

In the drawings, broad arrows represent busses for multiple-bit parallel digital signals. These busses carry eight-bit signals unless otherwise indicated by a slash across the bus and an adjacent number. Line arrows represent connections carrying analog signals or single bit digital signals. A small circle at the input terminal of a logic element indicates that the element responds to the logical complement of the signal applied to that terminal. Depending on the processing speed of the devices, compensating delays may be required in certain of the signal paths. One skilled in the art of digital circuit design would know where such delays would be needed in his particular system.

In the video signal processing system shown in FIG. 2, analog composite video signals, from a source of composite video signals 10, are applied to buffer amplifier 12. Source 10 may include, for example, the tuner, intermediate frequency amplifier, and video detector of a conventional color television receiver. Buffer amplifier 12 increases the magnitude of the signals from source 10 to an appropriate level for quantization by ADC 14. Buffer 12 may be a conventional video amplifier having a frequency response curve that is essentially flat from approximately 30 Hz to 4 MHz. It is this video amplifier and the video amplifiers that process the signal prior to transmission which may introduce low frequency distortion components such as those described above in reference to FIG. 1. Amplified composite video signals are provided by amplifier 12 to ADC 14.

ADC 14 effectively adds a dither signal to the analog composite video signals from amplifier 12 and converts the dithered analog signals into digital samples. ADC 14 is controlled by a sampling clock having a frequency four times the frequency of the chrominance subcarrier ($4f_{sc}$). This sampling clock signal is provided by timing processor 38. In addition, processor 38 provides clock signals at the horizontal line rate, $f_H$, at one-half of the horizontal line rate, $f_H/2$, and at the color subcarrier frequency, $f_{sc}$, and a burst gate signal, BG, that is in a logic high state only during the burst interval. A signal BG' is also applied to ADC 14, this signal is the burst gate signal, BG, delayed by one $4f_{sc}$ clock period. These signals are used by ADC 14 to control generation of the dither signals. The dither signal and the apparatus in the ADC 14 which effectively adds the dither signal to the analog composite video signal are described below in reference to FIGS. 4 through 6. To understand the general operation of the system, assume that the dither signal has the following components: an $f_H/2$ dither signal which is added to the entire composite video signal and a multi-valued $f_{sc}/2$ dither signal which is added only to the burst signal.

Since different values of dither are applied to the burst signal at an $f_{sc}/2$ rate, only one value of dither is applied to each cycle of the burst signal. Consequently, the quantization level transitions induced by this dither signal may be asymmetric. For example, a dither induced transition to a different quantization level for a sample taken in the positive portion of a burst cycle may not be matched by a similar transition for the corresponding sample taken in the negative portion of the burst cycle. Because of this asymmetry, the digital signal representing the dithered analog burst signal may also include dither induced components which change in magnitude at a $2f_{sc}$ rate.

ADC 14 produces seven bit samples representing the dithered analog composite video signal. These samples are applied to comb filter 16. Comb filter 16, which may be a conventional 1H comb filter, separates the luminance and chrominance components from the composite video samples by averaging corresponding samples from adjacent lines. This averaging process attenuates the components of the dither signal at $f_H/2$, providing luminance and chrominance samples that have eight-bit resolution. The comb filtered chrominance samples are applied to low-pass filter 18 which extracts low frequency luminance vertical detail information.

The vertical detail samples from low-pass filter 18 are combined with the luminance signal samples from comb filter 16 by adder 20. The samples provided by adder 20 may be applied to conventional luminance signal processing circuitry (not shown) which provides signals to drive an image reproduction device (not shown).

Samples from low-pass filter 18 are also subtracted from the comb filtered chrominance samples from filter 16 by subtracter 24 to produce high-pass filtered combed chrominance samples. Delay element 22 provides compensating delay to the samples from comb filter 16 equal to the processing time through low-pass filter 18.

The sample averaging done in the high-pass filtering of the chrominance samples attenuates the $f_{sc}/2$ dither signal components, providing chrominance samples that have nine-bit resolution.

Samples from subtracter 24 are applied to band-pass filter 26 which further attenuates high and low frequency noise components of the chrominance samples. In the NTSC system, filter 26 may have a pass band that is 1 MHz wide, centered about $f_{sc}$. In the present embodiment, filter 26 includes elements which trap signals having frequencies substantially equal to $f_{sc}/2$ and $2f_{sc}$. A chroma band-pass filter which may be used with this embodiment is disclosed in FIG. 4 of Fischer, T. "Digital VLSI Breeds Next-generation TV Receivers" Electronics, Aug. 11, 1981, pp. 97–103. $4f_{sc}$ samples which are separated by four sampling intervals are averaged by this filter.

This averaging further attenuates the components of the burst dither signal having a frequency of $f_{sc}/2$ and also attenuates the dither induced components having a frequency of $2f_{sc}$. To preserve the increase in quantization resolution provided by the dither signal, ten-bit sample codewords are provided by the filter, representing the average values of two nine-bit samples processed by the band-pass filter.

The ten-bit samples from filter 26 are applied to chrominance signal demodulator 28. Two quadrature phase related $2f_{sc}$ clock signals, the R-Y clock and the B-Y clock, are applied to the chroma demodulator 28 by digital timing processor 38. Demodulator 28 may be a conventional digital color difference signal demodulator which includes a demultiplexer that is responsive to the R-Y and B-Y clock signals for separating the $4f_{sc}$ sequence of chrominance samples into separate sequences of R-Y and B-Y color difference signal samples, each having a $2f_{sc}$ rate. The demodulator may include further circuitry to remove the color subcarrier from the R-Y and B-Y sequences. The samples provided by the demodulator represent baseband R-Y and B-Y color difference signals. The eight most significant bits of these sequences of samples may be applied to a color difference signal processing circuit (not shown) which provides signals to drive an image reproduction device (not shown).

Ten-bit R-Y samples are provided to phase detector 30 by chroma demodulator 28. The R-Y clock signal, the burst gate signal, BG, and the $F_H/2$ clock signal are applied to phase detector 30 by digital timing processor 38. Phase detector 30 is shown in detail in FIG. 3. The ten-bit R-Y samples from demodulator 28 are applied to latch 310. The R-Y codewords are loaded into latch 310 on the leading edges of the clock pulses applied to the latch by AND gate 312. The clock signal provided by gate 312 is the logical AND of the R-Y clock and the burst gate signal, BG, provided by digital timing processor 38. The codewords stored in latch 310 correspond to samples of the R-Y phase of the burst component. These samples are applied to an accumulator which includes adder 314 and latch 316. Adder 314 sums the ten-bit samples from latch 310 with accumulated fifteen-bit samples provided by latch 316. The samples provided by adder 314 are loaded into latch 316 on the leading edges of the clock pulses provided by delay element 318. The clock signal from AND gate 312 is applied to latch 316 through delay element 318 which compensates for the processing time through adder 314. The fifteen-bit samples provided by latch 316 are applied to latch 322 and correspond to the accumulated sum of thirty-two ten-bit R-Y samples taken during two burst intervals. The fifteen-bit samples are loaded into latch 322 on the leading edge of the $F_H/2$ clock pulses applied to the clock input of latch 322 by timing processor 38. The accumulated burst samples are thus stored in latch 322 for two horizontal line periods. The $F_H/2$ clock pulses are also applied via delay element 320 to the reset input of accumulator latch 316. Delay element 320 provides sufficient delay to allow the samples stored in latch 316 to be transferred to latch 322 before latch 316 is reset.

Since latch 316 is reset by the $F_{sc}/2$ clock signal, the samples transferred from latch 316 to latch 322 represent the accumulated sum, over two burst intervals, of the values of the R-Y color difference signal samples. The samples from phase detector 30 are applied to the input port of low-pass filter 32. The $F_H/2$ clock signal is applied to filter 32 by timing processor 38. Filter 32 averages the samples provided by phase detector 30 to apply a slowly varying fifteen-bit digital signal to digital-to-analog converter (DAC) 34. DAC 34 transforms this digital signal into an analog control signal which is applied to voltage controlled oscillator (VCO) 36. VCO 36 may be a conventional voltage controlled oscillator which generates a $4f_{sc}$ sinusoidal signal. The frequency and phase of this signal are locked relative to the frequency and phase of the $f_{sc}$ burst signal by the control potential developed in DAC 34. VCO 36 provides an input signal to digital timing processor 38. Seven-bit composite video samples are provided to timing processor 38 by ADC 14. Timing processor 38 may include circuitry for converting the $4f_{sc}$ sinusoidal signal from VCO 36 into a square wave $4F_{sc}$ clock signal, and for frequency dividing this signal to provide the R-Y and B-Y clock signals, each at $2f_{sc}$. In addition, timing processor 38 may include circuitry responsive to the horizontal synchronization pulses in the composite video samples from ADC 14 for generating the $F_H$ and $F_H/2$ clock signals and for generating the burst gate signal, BG. BG is applied to delay element 39 which provides a burst gate signal, BG', that is delayed by one period of the $4F_{sc}$ clock signal with respect to BG. Timing processor 38 is not shown in detail since it is not considered a part of this invention. It may be built by one skilled in the art from conventional devices.

In the embodiment described above, digitized samples representing the dithered analog composite video signals are processed by comb filter 16, low-pass filter 18 and band-pass filter 26 before they are processed by phase detector 30. It is phase detector 30, however, which can provide the greatest increase in resolution since it sums thirty-two burst samples.

FIG. 6A illustrates a burst interval; FIG. 6B, the coincident burst gate pulse (BG); and FIG. 6C, the R-Y clock signal. FIGS. 6D and 6E illustrate dither signals that may be added to the burst intervals of two sequential horizontal lines. It is noted that the burst gate pulse spans eight cycles of the burst signal and that the leading edge of the R-Y clock signal is substantially coincident with the zero crossings of the burst signal. As described above, the dither signal includes a component which is applied to the entire horizontal line and a component which is applied only to the burst interval. The waveforms illustrated by the dashed lines 601 and 603 of FIGS. 6D and 6E respectively represent the dither component that is applied to the entire horizontal line. This component has a frequency of $f_H/2$ and alternates between $+\frac{1}{4}$ and $-\frac{1}{4}$ of a quantization level. Since the quantization level is 1.1 IRE in the present embodiment this signal alternates between 0.28 IRE and $-0.28$ IRE.

The burst only dither signal used by the present embodiment is illustrated by waveforms 602 and 604 of FIGS. 6D and 6E. This signal changes in magnitude by 1/16 of a quantization level at a rate of $f_{sc}/2$ but changes in sign at an $f_{sc}$ rate. The minimum magnitude of the burst dither is zero and the maximum magnitude is $\frac{1}{4}$ of a quantization level. It is noted that the combination of the burst only dither and the $f_H/2$ dither components yields a dither signal having 16 levels which accurately subdivide the quantization level. The dither waveforms of FIGS. 6D and 6E are shown in terms of their IRE levels to aid comparison with the burst waveform shown in FIG. 6A. The dither signal of the present invention is not limited to having particular IRE values, however, it may have any combination of alternately relatively positive and negative values which subdivide the value represented by the least significant bit of the digital codeword produced by the ADC.

The primary components of this dither signal are at frequencies of $f_H/2$ and $f_{sc}/2$. As set forth above, these dither signal components may induce magnitude changes in the digitized burst signal which occur at a $2f_{sc}$ rate. The $f_H/2$ and $f_{sc}/2$ components of the dithered burst signal are attenuated by comb filter 16 and by the high-pass filter formed by low-pass filter 18, delay element 22 and subtracter 24. The comb filter averages pairs of seven-bit samples to produce eight-bit samples and the high-pass filter averages pairs of the eight-bit samples to produce nine-bit samples. The $f_{sc}/2$ and $2f_{sc}$ components of the digitized burst signal are attenuated by sample averaging in band-pass filter 26. Filter 26 produces samples having ten-bit resolution by averaging pairs of nine-bit samples from the high-pass filter.

Chroma demodulator 28 passes the R-Y burst samples to phase detector 30. As shown in FIGS. 6A and 6C, the R-Y samples of the color burst signal are ideally at the zero crossing points of the burst waveform. Phase detector 30 averages these samples over two burst intervals and provides samples representing the value of the samples which will be the zero-crossing samples when the loop is locked. Since this value is zero when the phase difference between the sampling clock signal and the burst is zero, the samples provided by phase detector 30 represent the phase error of the VCO. Phase detector 30 produces fifteen-bit samples by summing the R-Y samples from two burst intervals. The phase error samples from phase detector 30 are filtered over several horizontal line periods by low-pass filter 32 and applied to DAC 34 which provides the analog control signal that changes the frequency of VCO 36.

Assuming that the dither signal accurately subdivides the quantization level of the ADC and that the dither signal components of the burst signal are properly matched to the filters in the signal processing system, phase accuracies of 0.5° or better can be achieved by this system. Since the desired phase error is 5° or less, relatively large tolerances in the values of the components used in the system can be accommodated.

It is contemplated that the high-pass filter, formed by low-pass filter 18, delay element 22 and subtracter 24, and the band-pass filter 26 may be replaced by a single band-pass filter. For example, the cascade combination of two filters having respective transfer functions of $1-Z^{-2}$ and $1+Z^{-4}$ (in Z transform notation) would perform the same functions as the high-pass filter and band-pass filter described above. In the $1-Z^{-2}$ filter, samples delayed by two $4F_{sc}$ clock periods are subtracted from undelayed samples. This filter tends to peak the $f_{sc}$ components of the dithered burst samples relative to higher and lower frequency components and to trap components at $2f_{sc}$. The $1-Z^{-2}$ filter thus attenuates the $f_{sc}/2$ and $2f_{sc}$ dither induced components of the burst signal relative to the $f_{sc}$ component. In the $1+Z^{-4}$ filter, samples delayed by four $4F_{sc}$ clock periods are added to undelayed samples. This filter is a notch filter which tends to remove the $f_{sc}/2$ components of dithered burst signal. Since each of these filters attenuates dither induced components of the digital signal, each increases the quantization resolution of the system. Consequently, the eight-bit chrominance samples applied to the input port of the filter become ten-bit samples at its output port.

In the embodiment and example described above, any filtering step which significantly attenuates a component of the dither signal increases the resolution of the samples by providing codewords at its output port that are one bit wider than the codewords applied to its input port. The filters are shown as operating in this manner to simplify explanation of the resolution enhancing properties of the system. It is contemplated, however, that the number of bits in the codewords that are processed by each of the filters may be decreased by including automatic chrominance control (ACC) circuitry in the system. An ACC system may, for example, normalize the samples to increase the amplitude of samples representing weak burst signals. The resolution of these samples is not improved by this normalization. For example, samples which occupy only the low-order six bits in a seven-bit codeword can be scaled by a factor of two by shifting the samples to more significant bit positions by one bit. This shifting operation does not, however, change the quantization resolution of the samples. Even though the samples now occupy seven bits they still have six-bit quantization resolution. However, when a filter averages two of these seven-bit samples and, via dither processing, increases the resolution of the samples by one bit, no extra bits need to be added to the seven-bit codeword to retain the increase in resolution.

If an ACC system were inserted in the embodiment described above, phase detector 30 could provide equivalent sample resolution by providing eleven-bit samples. This ACC system could be included at various points in the phase locked loop. No ACC system is described in detail because it is not considered a part of the present invention.

Figure 5:
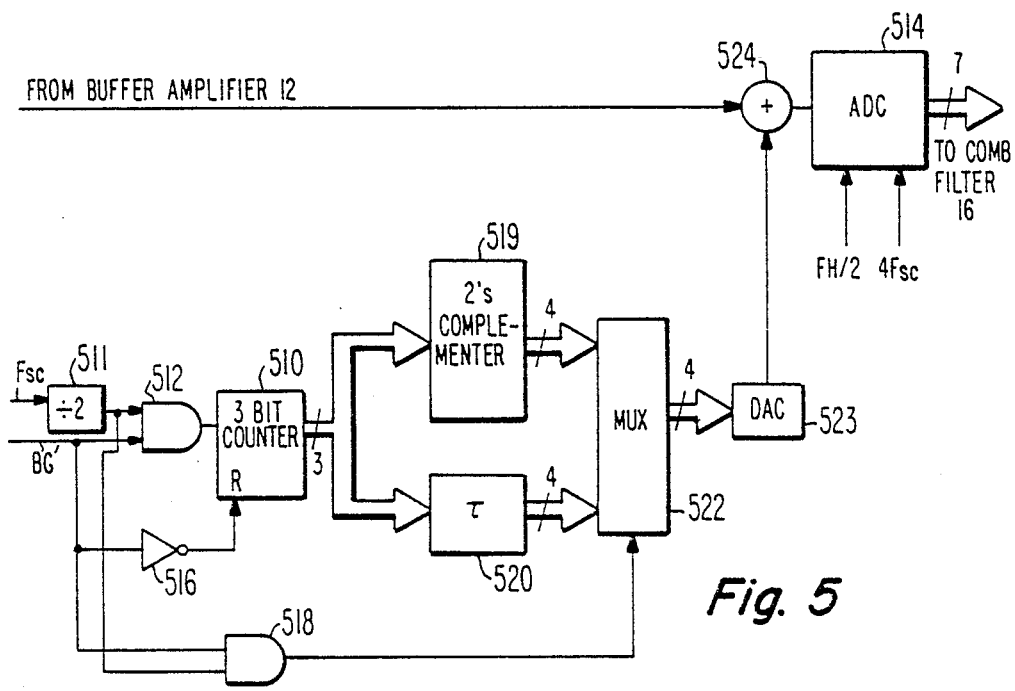
FIG. 5 is a block diagram of an alternative embodiment of an ADC which may be used in the circuit shown in FIG. 2.
Figure 4:
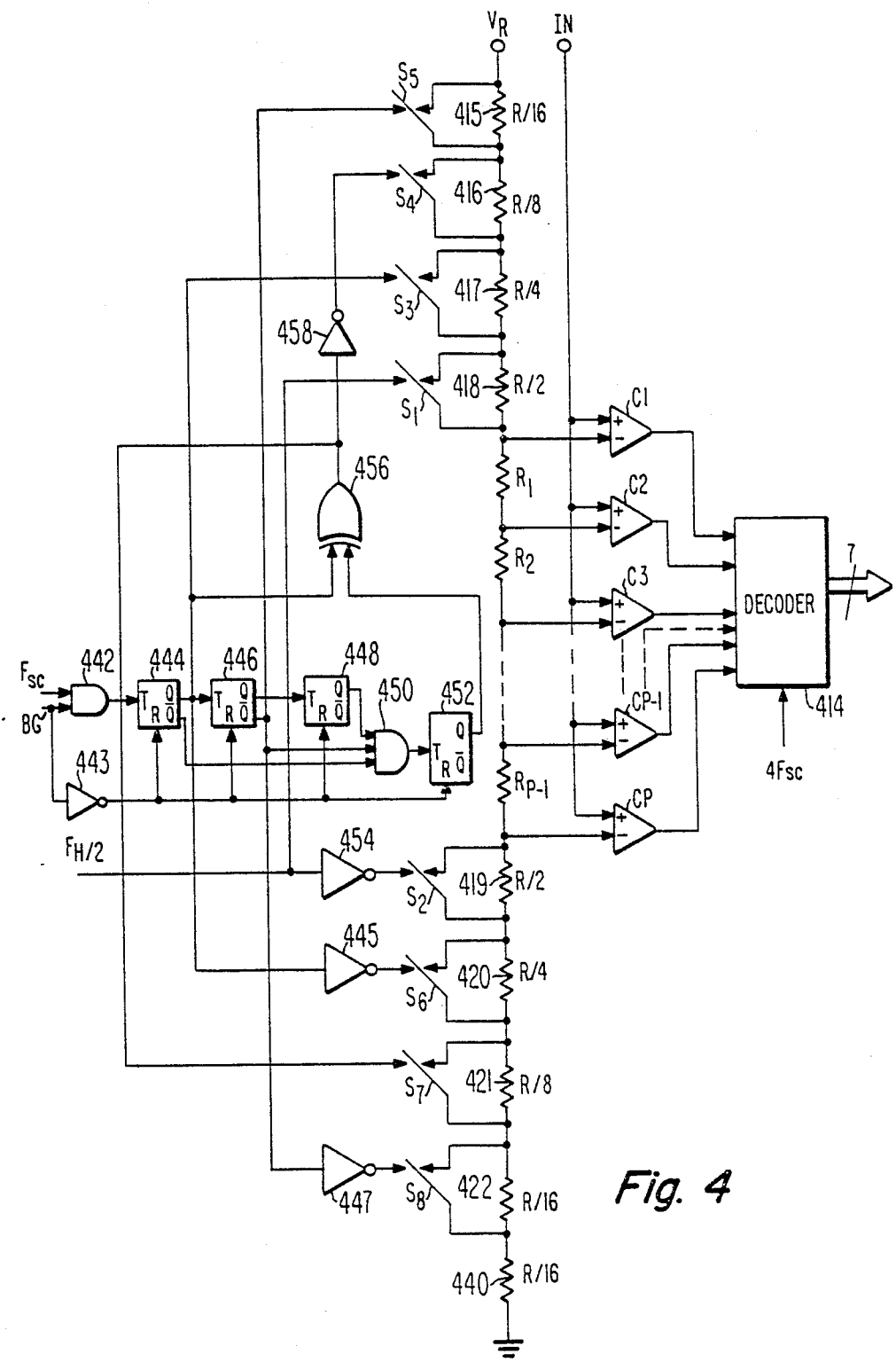
FIG. 4 is a schematic diagram, partially in block diagram form of an ADC which may be used in the circuit shown in FIG. 2.

ADC's suitable for use in the present invention are shown in FIGS. 4 and 5. FIG. 4 shows an embodiment in which dither signals are used to change the reference voltage levels of ADC 14. A plurality of resistors are connected in series between a source of reference potential, $V_R$, and ground. These resistors proportion the potential coupled across the series connection to develop a plurality of reference levels at their interconnections. Resistors $R_1, R_2 \ldots R_{P-1}$ each have resistance value R and each develops a voltage equivalent to that represented by one LSB of the digital samples produced by ADC 14. This voltage determines the quantizing resolution.

The interconnections of these resistors, $R_1, R_2 \ldots R_{P-1}$ are coupled to respective inputs of differential comparators C1, C2, C3 ... CP. Comparators C1 through CP have second inputs which receive the analog composite video signals present at node IN (note that these signals are not dithered in this embodiment).

Resistors 418 and 419 are positioned on opposite ends of the $R_1, R_2 \ldots R_{P-1}$ resistor chain and are alternately switched into and out of the resistor chain by respective shunting switches $S_1$ and $S_2$. These switches and the other switches $S_3$ through $S_8$, used in this embodiment of the ADC, may be switched open or closed in response to logic low or logic high control signals respectively. The $F_H/2$ clock signal is applied to control switch $S_1$ and through inverter 454 to control switch S2. At any given time, one of the switches S1 and S2 is open and the other is closed. Resistors 418 and 419 are chosen to have resistances of R/2 so that whichever one of them is not shorted by switches S1 and S2 develops a voltage equivalent to one-half of the quantization level. These resistors provide a $\pm\frac{1}{4}$ LSB magnitude dithering change at the reference voltage input of each comparator C1 through CP. This dither signal is applied during the entire horizontal line period.

The burst-only dither signal is developed by similar means. Resistors 415 through 417 are connected in series at the end of the resistor chain that is coupled to reference potential $V_R$ and resistors 420 through 422 are connected in series at the end that is coupled to ground potential. Resistor 417 is shunted by switch $S_3$, resistor 416, by switch $S_4$ and resistor 415, by switch $S_5$. Similarly, resistors 420, 421 and 422 are shunted by switches $S_6$, $S_7$ and $S_8$ respectively. The switches $S_3$ through $S_8$ are controlled by clock signals derived from the $F_{sc}$ clock signal and burst gate signal BG' provided by timing processor 38 via delay element 39. The BG' and $F_{sc}$ clock signals are applied to the input terminals of AND gate 442 which outputs an $F_{sc}$ clock signal only during the delayed burst interval, providing a logic low state during the remainder of the horizontal line interval. This signal is applied to toggle flip-flop 444 which is the first stage of a three-bit counter formed by flip-flops 444, 446 and 448.

Each of the flip-flops 444 through 448 and flip-flop 452 has a toggle input terminal, T, a reset input terminal, R, and complementary output terminals Q and $\overline{Q}$. The Q output terminal of flip-flop 444 is connected to the T input terminal of flip-flop 446 and the Q output terminal of flip-flop 446 is connected to the T input terminal of flip-flop 448. The Q output terminal of flip-flop 444 provides the control signal to switch $S_3$ and, via inverter 445, to switch $S_6$. Similarly, the $\overline{Q}$ output terminal of flip-flop 446 provides the control signal to switch $S_5$ and, via inverter 447, to switch $S_8$. The $\overline{Q}$ output terminals of flip-flops 444 and 446 and the Q output terminal of flip-flop 448 are connected to the input terminals of three input AND gate 450. AND gate 450 provides a signal to the toggle input terminal, T, of flip-flop 452. Output terminal Q of flip-flop 452 is connected to one input terminal of exclusive OR gate 456, the second input terminal of which is connected to the Q output terminal of flip-flop 444. Exclusive OR gate 456 provides the control input signals to switch $S_7$ and, via inverter 458, to switch $S_4$. The reset input terminals of flip-flops 444, 446, 448 and 452 are responsive to an inverted BG' signal provided by delay element 39 via an inverter 443. As set forth above, each of the switches $S_1$ through $S_8$ shunts a different one of the resistors 415 through 422 respectively. The values of resistors 415 through 422 are chosen to vary the level of the reference signal applied to each of the comparators by effectively adding a dither signal such as shown in FIGS. 6D and 6E. Resistors 415 and 422 have resistances of R1/16, resistors 416 and 421, resistances of R/8, resistors 417 and 420, resistances of R/4 and resistors 418 and 419, resistances of R/2.

Switches $S_1$ and $S_2$ form a complementary pair of switches as do switches $S_3$ and $S_6$, switches $S_4$ and $S_7$ and switches $S_5$ and $S_8$. Whenever one switch in the complementary pair is open, the other is closed and vice-versa. Switches $S_1$ and $S_2$ reverse states on each horizontal line to provide a dither signal over the entire horizontal line represented by the dashed-line waveforms 601 and 603 of FIGS. 6D and 6E respectively. The burst dither signals developed across resistors 415 through 417 and resistors 420 through 440 are added to the horizontal line dither signals to produce composite dither signals represented by waveforms 602 and 604 of FIGS. 6D and 6E respectively. Table 1 shows the effective burst-only dither signal as fractions of the value represented by one LSB, the states of the switches $S_3$ through $S_8$ and the composite values of the series resistances 415 through 417 and 420 through 440.

TABLE 1

| Burst-Only Component Of Dither Signal | Switch States O=Open, C=Closed | | | Composite Resistance of Resistors 415, 416 & 417; Resistors 420, 421, 422 & 440 | |
|---|---|---|---|---|---|
| | $S_5/S_8$ | $S_4/S_7$ | $S_3/S_6$ | | |
| 0 | C/O | C/O | O/C | $\frac{1}{4}$ R; | $\frac{1}{4}$ R |
| +1/16 | O/C | O/C | C/O | 3/16 R; | 5/16 R |
| −1/16 | O/C | O/C | O/C | 5/16 R; | 3/16 R |
| +$\frac{1}{8}$ | C/O | O/C | C/O | $\frac{1}{8}$ R; | $\frac{3}{8}$ R |
| −$\frac{1}{8}$ | C/O | O/C | O/C | $\frac{3}{8}$ R; | $\frac{1}{8}$ R |
| +3/16 | O/C | C/O | C/O | 1/16 R; | 7/16 R |
| −3/16 | O/C | C/O | O/C | 7/16 R; | 1/16 R |
| +$\frac{1}{4}$ | C/O | C/O | C/O | 0 R; | $\frac{1}{2}$ R |

The control signals applied to the switches $S_3$, $S_4$ and $S_5$ and to the switches $S_6$, $S_7$ and $S_8$ may be considered to be two three-bit digital signals which control the amount by which the reference signals applied to each of the comparators $C_1$-$C_P$ change. Since the resistors 415-417 have progressively increasing values, the signals controlling the switches $S_5$, $S_4$ and $S_3$ have progressively increasing significance in the first one of these digital signals. Assigning a value of 1 to the open state of a switch and a value of 0 to the closed state, the digital signal which controls the switches $S_3$, $S_4$ and $S_5$ as shown in Table I, has successive values of 4, 3, 5, 2, 6, 1, 7 and 0. Subtracting 4 from each of these values yields the sequence 0, −1, +1, −2, +2, −3, +3, −4. The values in this sequence monitonically increase in magnitude and alternate in polarity. When each of the values in this sequence is divided by 16, the effective burst-only dither signal, as set forth in Table I, is obtained.

FIG. 5 is a block diagram of an alternative embodiment of ADC 14. Analog composite video signals are applied to one input terminal of analog signal adder 524. The burst-only dither signal is applied to the other terminal of adder 524 by DAC 523. Adder 524 provides a dithered composite video signal to ADC 514 which effectively applies the $f_H/2$ dither signal internally and digitizes the resulting signal to produce samples which are applied to comb filter 16.

The $F_{sc}$ clock signal and the delayed burst gate signal BG', provided by timing processor 38 via delay element 39, are applied to the input terminals of the circuitry that generates the burst dither signal. Clock signal $F_{sc}$ is applied to frequency divider 511. Divider 511 provides an $F_{sc}/2$ clock signal to one input terminal of AND gate 512. Burst gate signal BG' is applied to the other input terminal of AND gate 512 which provides the $F_{sc}/2$ clock signal only during the burst interval to counter 510. Counter 510 may be a conventional three bit counter having a reset input terminal. Counter 510 is reset to zero at the end of each burst interval by the complement of signal BG' supplied by inverter 516 to its reset input terminal. The starting value for the counter for each burst period is, therefore, zero. The value in the counter is incremented by one for each pulse of the $F_{sc}/2$ clock signal. Over the eight burst cycle intervals encompassed by the burst gate signal, counter 510 applies the digital values 0 through 4 to the 2's complementer 519 and to the delay element 520. 2's complementer 519 provides four-bit digital codewords to multiplexer 522 that are the 2's complement of the three-bit input codeword as illustrated by table 2.

TABLE 2

| 3 Bit Codeword | 4 Bit 2's Complement Codeword |
| --- | --- |
| 000 | 0000 |
| 001 | 1111 |
| 010 | 1110 |
| 011 | 1101 |
| 100 | 1100 |

Delay element 520 provides compensating delay equal to the processing time through 2's complementer 519. The three bits passed by delay element 520 are applied to multiplexer 522 as a four-bit signal, the most significant bit being zero. The burst gate signal BG' and the $F_{sc}/2$ clock signal from frequency divider 511 are applied to AND gate 518. Gate 518 develops the control signal applied to multiplexer 522. When this control signal is in a logic low state, samples provided by delay element 520 are applied to DAC 523 and when the control signal is in a logic high state, samples provided by 2's complementer 519 are applied to DAC 523. DAC 523 converts these digital codewords having values that range between −3 and +4 into analog signals having values that range between −3/16 LSB and +¼LSB with a granularity of 1/16 LSB, i.e. the value produced by DAC 523 is one-sixteenth of the value represented by LSB multiplied by the value of the input codeword. The dither signals provided by this circuitry and by ADC 514 are substantially the same as the waveforms shown in FIGS. 6D and 6E.

What is claimed is:

1. A system for processing an analog signal having components occupying a predetermined band of frequencies including a reference frequency comprising:
   a source of reference signal;
   an analog-to-digital converter, coupled to said source of reference signal and to said analog signal for developing digital samples representing said analog signal;
   first means for generating a digital control signal having a plurality of successive levels over a predetermined number of sample intervals, said levels having monotonically changing magnitudes and having polarities which alternate with respect to a predetermined reference level; and
   second means coupled to said analog-to-digital converter and responsive to said digital control signal for changing the amplitude of one of said analog signal and said reference signal by amounts proportional to the level of said digital control signal.

2. The system set forth in claim 1 wherein said first means comprises:
   means for changing the level of said digital control signal at a rate substantially equal to said reference frequency.

3. The system set forth in claim 1 wherein said first means comprises:
   means for changing the magnitude of said digital control signal at a first rate; and
   means for changing the polarity of said digital control signal with respect to said reference level at a second rate wherein said second rate is not lower than said first rate.

4. The system set forth in claim 3 wherein said first rate is a subharmonic frequency of said reference frequency.

5. The system set forth in claim 4 further comprising:
   a filter coupled to said analog-to-digital converter for attenuating the components of said digital samples occupying frequencies that are subharmonic to said predetermined band of frequencies to increase the quantization resolution of said digital samples.

6. The system set forth in claim 4 wherein:
   said analog-to-digital converter comprises a plurality of serially connected resistance means coupled to receive said reference signal thereacross, a plurality of comparators having respective first and second inputs, means for coupling respective ones of said first inputs to successive interconnections of said plurality of resistance means, and means for coupling said analog signal to said second inputs of said plurality of comparators; and
   said first means comprises:
      a source of first clocking signal having a rate substantially equal to said first rate;

a source of second clocking signal having rate substantially equal to said second rate wherein said first and second clocking signals are components of said digital control signal; and said second means comprises:

first and second serially connected further resistance means, coupled between said plurality of serially connected resistance means and said source of reference signal;

a first controllable switching means coupled to said first further resistance means and responsive to said first clocking signal for selectively providing a connection thereacross; and a second controllable switching means coupled to said second further resistance means and responsive to said second clocking signal for selectively providing a connection thereacross.

7. The system set forth in claim 4 wherein said first means comprises:

a source clocking signal having a frequency substantially equal to a subharmonic of said reference frequency;

a counter, responsive to said clocking signal for developing digital values representing the number of clock pulses that have been applied to said counter;

controllable complementing means coupled to said counter and responsive to said clocking signal for providing samples representing complemented and uncomplemented digital values provided by said counter; and said second means comprises:

digital-to-analog conversion means coupled to said controllable complementing means for generating a dither signal representing the digital values provided by said controllable complementing means; and means coupled to said digital-to-analog conversion means, and to said analog-to-digital converter for adding said dither signal to said analog signal.

8. In a video signal processing system including a source of analog composite video signal having luminance signal components and chrominance signal components including a color reference burst signal component, apparatus comprising:

a source of reference signal;

an analog-to-digital converter, coupled to said source for developing digital samples representing said analog signal;

first means for generating a digital control signal having a plurality of successive levels over a predetermined number of sample intervals, said levels having monotonically changing magnitudes and successive levels having polarities which alternate with respect to a predetermined reference level; and second means coupled to said analog-to-digital converter and responsive to said digital control signal for changing the amplitude of one of said analog composite video signal and said reference signal by amounts proportional to the levels of said digital control signal.

9. The system set forth in claim 8 wherein said first means comprises:

means for changing the level of said digital control signal at a rate substantially equal to a subharmonic frequency of said color reference burst signal.

10. The system set forth in claim 9 wherein said first means comprises:

means for changing the magnitude of said digital control signal at a first rate; and means for changing the polarity of said digital control signal with respect to said reference level at a second rate wherein said first and second rates are substantially equal to respective subharmonic frequencies of said color reference burst signal, said second rate being higher than said first rate.

11. The system set forth in claim 10 wherein:

said analog-to-digital converter comprises a plurality of serially connected resistance means coupled to receive said reference signal thereacross, a plurality of comparators having respective first and second inputs, means for coupling respective ones of said first inputs to successive interconnections of said plurality of resistance means, and means for coupling said analog composite video signal to said second inputs of said plurality of comparators;

said first means comprises:

a source of first clocking signal having a rate substantially equal to said first rate;

a source of second clocking signal having a rate substantially equal to said second rate wherein said first and second clocking signals are components of said digital control signal; and said second means comprises:

first and second serially connected further resistance means coupled between said plurality of serially connected resistance and said source of reference signal;

a first controllable switching means coupled to said first further resistance means and responsive to said first clocking signal for selectively providing a connection thereacross; and a second controllable switching means coupled to said second further resistance means and responsive to said second clocking signal for selectively providing a connection thereacross.

12. The system set forth in claim 10 wherein:

said first means comprises:

a source of clocking signal having a frequency substantially equal to a subharmonic frequency of said color burst reference signal;

a counter, responsive to said clocking signal for developing digital values representing the number of clock pulses that have been applied to said counter;

controllable complementing means coupled to said counter and responsive to said first clocking signal for alternately providing samples representing complemented and uncomplemented digital values provided by said counter; and said second means comprises:

digital-to-analog conversion means coupled to said controllable complementing means for generating a dither signal representing the digital values provided by said controllable complementing means; and means coupled to said digital-to-analog conversion means, and to said analog-to-digital converter for adding said dither signal to said analog composite video signal.

13. In a digital television receiver including a source of analog composite video signals having luminance and chrominance signal components including a color reference burst signal component, apparatus comprising:

means for generating a dither signal having a plurality of successive levels over a predetermined number of sample intervals, said levels having monotonically changing magnitudes and successive levels having polarities which alternate with respect to a predetermined reference level, said levels changing at a rate substantially equal to the frequency of said color burst reference signal;

a source of sampling clock signal;

an analog-to-digital converter responsive to said sampling clock signal for developing digital samples corresponding in magnitude to the magnitude of said analog composite video signals at instants determined by said sampling clock signal;

means coupled to said dither signal generating means and to said analog-to-digital for changing the correspondence between the magnitude of said digital samples and said analog composite video signals by amounts proportional to the values of said dither signal;

filtering means coupled to said analog-to-digital converter for averaging predetermined ones of said digital samples to attenuate components of said digital samples occupying frequencies subharmonic to said color reference burst signal and to increase the quantization resolution of said digital samples.

14. An analog-to-digital conversion system for converting a narrow band component of an analog signal to digital format comprising:

an analog-to-digital converter for developing digital samples which correspond to discrete quantized magnitude values of said narrow band component; and means cooperating with said analog-to-digital converter for changing the correspondence between the respective magnitudes of said narrow band component and said digital samples wherein the correspondence changes monotonically in magnitude at a first rate and the correspondence changes in relative polarity at a second rate.

* * * * *

UNITED STATES PATENT AND TRADEMARK OFFICE
CERTIFICATE OF CORRECTION

PATENT NO. : 4,647,968

DATED : Mar. 3, 1987

INVENTOR(S) : Donald H. Willis

It is certified that error appears in the above-identified patent and that said Letters Patent is hereby corrected as shown below:

Column 15, line 14     following "analog-to-digital" insert --converter--;

Column 15, line 15     "magnitude" should be --magnitudes--.

Signed and Sealed this

Twenty-sixth Day of January, 1988

Attest:

DONALD J. QUIGG

Attesting Officer      Commissioner of Patents and Trademarks